(12) United States Patent
Yano et al.

(10) Patent No.: US 7,251,161 B2
(45) Date of Patent: Jul. 31, 2007

(54) SEMICONDUCTOR DEVICE AND METHOD OF CONTROLLING SAID SEMICONDUCTOR DEVICE

(75) Inventors: Masaru Yano, Tokyo (JP); Hiroki Murakami, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/290,001

(22) Filed: Nov. 30, 2005

(65) Prior Publication Data

US 2006/0215477 A1 Sep. 28, 2006

Related U.S. Application Data

(63) Continuation of application No. PCT/JP2004/17808, filed on Nov. 30, 2004.

(51) Int. Cl.
*G11C 11/34* (2006.01)
(52) U.S. Cl. .............................. 365/185.17; 365/185.18
(58) Field of Classification Search ........... 365/185.17, 365/185.18, 185.11, 185.28
See application file for complete search history.

(56) References Cited

U.S. PATENT DOCUMENTS

| 6,166,951 | A  | * | 12/2000 | Derhacobian et al. . 365/185.03 |
| 6,175,522 | B1 | * | 1/2001  | Fang ..................... 365/185.18 |
| 6,567,312 | B1 |   | 5/2003  | Torii et al. ............. 365/185.28 |
| 6,982,905 | B2 | * | 1/2006  | Nguyen ................. 365/185.17 |
| 2006/0256627 | A1 | * | 11/2006 | Kawai .................... 365/189.05 |

FOREIGN PATENT DOCUMENTS

| JP | 8-063989     | 3/1996  |
| JP | 11-086571    | 3/1999  |
| JP | 2001-518696  | 10/2001 |
| JP | 2001-308209  | 11/2001 |
| JP | 2001-325793  | 11/2001 |
| JP | 2003-204000  | 7/2003  |
| WO | WO 99/17294  | 4/1999  |

* cited by examiner

*Primary Examiner*—Anh Phung

(57) ABSTRACT

A semiconductor device includes: memory blocks each having groups of memory cells that are connected to word lines; select gates for selecting the groups of memory cells; and an apply circuit that applies, at the time of reading data, a back bias to the select gates of unselected memory blocks.

16 Claims, 17 Drawing Sheets

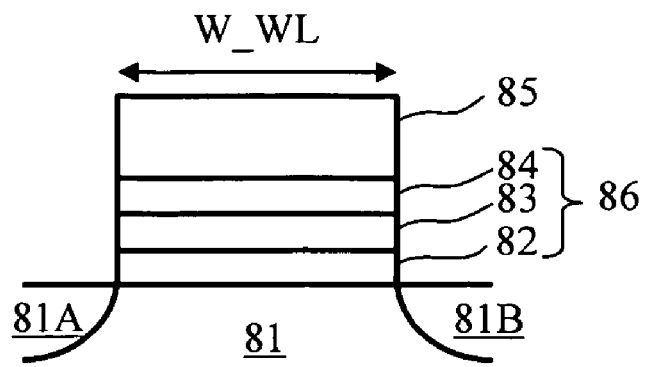
SONOS-type memory cell
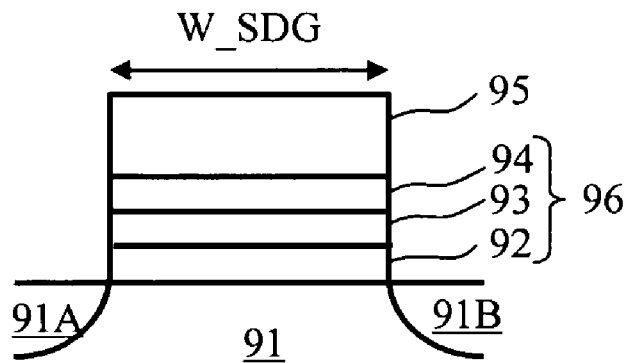
SONOS-type select drain gate SDG
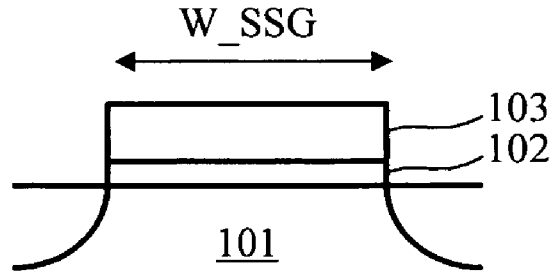
select source gate SSG

SEMICONDUCTOR DEVICE AND METHOD OF CONTROLLING SAID SEMICONDUCTOR DEVICE

CROSS REFERENCE TO RELATED APPLICATIONS

This is a continuation of International Application No. PCT/JP2004/017808, filed Nov. 30, 2004.

BACKGROUND OF THE INVENTION

1. Field of the invention

The present invention relates to a semiconductor device and a method of controlling the semiconductor device.

2. Description of the Related Art

NAND flash memories and AND flash memories are widely used as flash memories for storing data. Examples of NAND flash memories that have floating gates (FG) as charge accumulation layers are disclosed in Japanese Unexamined Patent Publication No. 2001-308209 and Japanese Laid-Open Patent Application No. 2001-518696.

FIG. 1 illustrates the array structure of a conventional FG-type NAND flash memory. In FIG. 1, WL000 through WL031 indicate word lines that are provided for one unit block, BLm indicates bit lines, and M indicates memory cells. The bit lines BLm are connected to page buffers $10_0$ through $10_m$. Every thirty-two memory cells M are connected in series so as to form one memory cell string for each bit line BLm in each one unit block. One end of each of the memory cell strings M000 through M031, ..., Mm00 through Mm31 is connected to an array Vss line ARVSS via select source gates SSG00 through SSG0m corresponding to the potential of a select line SSG0. The other end of each of the memory cell strings M000 through M031, ..., Mm00 through Mm31 is connected to the bit lines BL0 through BLm via select drain gates SDG00 through SDG0m and drain contacts $22_0$ through $22_m$ corresponding to the potential of a select line SDG0. A desired block is selected by controlling the select gate based on an address signal, and the other blocks remain unselected. The memory cells connected to each one unit in each block form one group (a memory cell group).

FIG. 2 is a cross-sectional view of a conventional FG-type NAND flash memory. In FIG. 2, memory cells are denoted by M, the bit line is denoted by BL, the select source gate is denoted by SSG, the select drain gate is denoted by SDG, a source diffusion layer is denoted by 11, a diffusion layer is denoted by 12, a drain diffusion layer 13 is denoted by 13, and a drain contact is denoted by 22. The line width of the select drain gate SDG is denoted by W_SDG, the line width of each memory cell M is denoted by W_WL, the gap between the select line SDGn and the adjacent word line WL is denoted by S_SDG-WL, and the gap between each two neighboring word lines is denoted by S_WL-WL. The relationship between the select drain gate SDG and the line width of each memory cell is expressed as W_SDG>W_WL. The relationship between the gap between the select line SDGn and the adjacent word line WL and the gap between each two neighboring word lines WL is expressed as S_SDG-WL>S_WL-WL.

FIG. 3A is a cross-sectional view of a cell of the FG-type NAND flash memory, and FIG. 3B is a cross-sectional view of a select gate. As shown in FIG. 3A, the memory cell M has a structure in which a tunnel oxide film 32, a polycrystalline silicon floating gate 33, an oxide film 34, a nitride film 35, an oxide film 36, and a control gate 37 are stacked in this order on a silicon substrate 31. As shown in FIG. 3B, the select gates SSG and SDG each have a structure in which an oxide film 42 and a gate electrode 43 are stacked in this order on a silicon substrate 41. Here, the relationship between the line width of each memory cell M W_WL and each line width of the select gates SSG and SDG is expressed as W_WL<W_SSG, W_SDG. Each of the line widths W_SSG and W_SDG is greater than the line width of each memory cell M W_WL, so that leakage can be prevented in the gate portion at the time of reading or programming. Also, the gap S_SDG-WL between the select gate and the adjacent word line is greater than the gap between each two neighboring word lines S_WL-WL, so that all the word lines WL have the same widths when being processed.

FIG. 4 shows the Vt distribution of the FG-type NAND flash memory. In an erasing state (data 1), the threshold value of a FG-type NAND flash memory cell is set to a negative value. In a writing state (data 0), the threshold value of a FG-type NAND flash memory cell is set to a positive value.

In recent years, NAND flash memories of a SONOS (semiconductor-oxide-nitride-oxide-semiconductor) type have been developed. A SONOS-type NAND flash memory stores information, using a nitride film as a charge accumulation layer, instead of a floating gate. This technique is disclosed in Japanese Unexamined Patent Publication No. 2003-204000. In a non-volatile semiconductor memory having a SONOS structure, multi-value information can be held by performing charge injection into a gate insulating film from the source side or the drain side.

In a conventional NAND cell array, blocks (erasing units) are divided using select gates, and various operations are performed with a selected one of the blocks. The unselected blocks are prevented from disturbance caused by the selected block.

However, as higher integration and lower voltages are being achieved, leakage current caused in unselected blocks at the time of reading or programming has become a problem, as accurate reading cannot be performed. Also, a core cell array has each one NAND string formed with thirty-two cells for higher integration these days. However, in a SONOS-type NAND flash memory, it is preferable to form a core cell array with sixteen cells, so as to reduce adverse influence of disturbance. In such a case, the number of drain contacts and source diffusion lines, as well as the number of select gates, becomes larger with respect to the memory cell region, compared with a conventional case. As a result, the entire device region becomes larger. Particularly, as illustrated in FIGS. 2 and 3, the line widths of the conventional select gates SDG and SSG are greater than the line widths of the memory cells. Therefore, the circuit size cannot be reduced as the number of select gates becomes greater.

SUMMARY OF THE INVENTION

It is therefore an object of the present invention to provide a semiconductor device and a method of controlling the semiconductor device in which the above disadvantage is eliminated.

A more specific object of the present invention is to provide a semiconductor device that can perform accurate reading and has a smaller circuit size, and a method of controlling the semiconductor device.

The above objects of the present invention are achieved by a semiconductor device that includes: memory blocks each having groups of memory cells that are connected to word lines; select gates for selecting the groups of memory cells; and an apply circuit that applies, at the time of reading data, a back bias to the select gates of unselected memory blocks. In accordance with the present invention, at the time of reading data, a back bias is applied to the select gates of unselected memory blocks, so as to completely turn off the select gates. Accordingly, leakage current in the unselected blocks at the time of reading data can be restricted. Thus, accurate reading can be performed, and the circuit size can be reduced.

Each of the select gates preferably includes a storage element. In accordance with the present invention, the select gates with storage elements are employed to make the threshold value higher than that of a regular transistor. In this manner, the select gates of unselected blocks can be certainly turned off, when predetermined voltages are applied to the gates. Accordingly, leakage in the unselected blocks can be restricted. Thus, accurate reading can be performed, and the circuit size can be reduced.

Each of the select gates is in a programmed state. In accordance with the present invention, the select gates are in a programmed state, so that the threshold value can be made higher than that of a regular transistor. In this manner, the select gates of unselected blocks can be certainly turned off, when predetermined voltages are applied to the gates. Accordingly, leakage in the unselected blocks can be restricted. Thus, accurate reading can be performed, and the circuit size can be reduced.

The above objects of the present invention are also achieved by a semiconductor device that includes: memory blocks each having groups of memory cells that are connected to word lines; and select gates that select the groups of memory cells, each select gate including a storage element. In accordance with the present invention, the select gates with storage elements are employed to make the threshold value higher than that of a regular transistor. In this manner, the select gates of unselected blocks can be certainly turned off, when predetermined voltages are applied to the gates. Accordingly, leakage in the unselected blocks can be restricted. Thus, accurate reading can be performed, and the circuit size can be reduced.

The semiconductor device of the present invention further includes select lines that are respectively connected to the select gates. It is preferable that each select line is spaced apart from an adjacent one of the word lines at the pitch at which the word lines are arranged. In accordance with the present invention, the gap between each select line and each adjacent word line is made equal to the gap between each two neighboring word lines. Thus, the circuit size can be reduced.

The semiconductor device of the present invention further includes select lines that are respectively connected to the select gates. It is preferable that each select line has a width substantially equal to the width of each word line. In this manner, the width of each select line, which is conventionally thick, can be made smaller. Thus, the circuit size can be reduced.

The memory cells are preferably of a floating gate type. Also, the memory cells are preferably of a SONOS type. The select gates preferably include the same type of transistors as that of the memory cells. The select gates preferably include floating gate type memory cells. The select gates preferably include SONOS-type memory cells. The select gates are preferably select drain gates. The memory cells of each of the groups are preferably connected in series and coupled to a corresponding one of the word lines. The semiconductor device is preferably a semiconductor memory device.

The above objects of the present invention are also achieved by a method of controlling a semiconductor device including memory blocks each having groups of memory cells connected to word lines, and select gates that select the groups of memory cells. This method includes the steps of: selecting one of the memory blocks at the time of reading data; and applying a back bias to the select gates of unselected memory blocks. In accordance with the present invention, at the time of reading data, a back bias is applied to the select gates of unselected memory blocks, so as to completely turn off the select gates. Accordingly, leakage current in the unselected blocks at the time of reading data can be restricted. Thus, accurate reading can be performed, and the circuit size can be reduced.

Each of the select gates preferably includes a storage element. In accordance with the present invention, the select gates with storage elements are employed to make the threshold value higher than that of a regular transistor. In this manner, the select gates of unselected blocks can be certainly turned off, when predetermined voltages are applied to the gates. Accordingly, leakage in the unselected blocks can be restricted. Thus, accurate reading can be performed, and the circuit size can be reduced.

Each of the select gates is in a programmed state. In accordance with the present invention, the select gates are in a programmed state, so that the threshold value can be made higher than that of a regular transistor. In this manner, the select gates of unselected blocks can be certainly turned off, when predetermined voltages are applied to the gates. Accordingly, leakage in the unselected blocks can be restricted. Thus, accurate reading can be performed, and the circuit size can be reduced.

The above objects of the present invention are also achieved by a method of controlling a semiconductor device including memory blocks each having groups of memory cells connected to word lines, and select gates selecting the groups of memory cells. This method includes the step of programming the select gates. In accordance with the present invention, data are stored in the select gates, so that the threshold value can be made higher than that of a regular transistor. In this manner, the select gates of unselected blocks can be certainly turned off, when predetermined voltages are applied to the gates. Accordingly, leakage in the unselected blocks can be restricted. Thus, accurate reading can be performed, and the circuit size can be reduced.

The above objects of the present invention are also achieved by a method of controlling a semiconductor device, including the steps of: precharging, at the time of reading data, a bit line running in memory blocks each having groups of memory cells connected to word lines, and select gates that select the groups of memory cells; and applying a back bias to the select gates of unselected blocks in a sensing period that follows a precharging period. In accordance with the present invention, the select gates can be certainly turned off, and leakage in the unselected blocks can be restricted. Thus, accurate reading can be performed, and the circuit size can be reduced. The method of the present invention further includes the steps of: erasing the memory cells of a selected block; and programming the select gates in the selected block having erased memory cells.

In accordance with the present invention, a semiconductor device that can perform accurate reading and has a smaller circuit size, and a method of controlling the semiconductor device can be provided.

BRIEF DESCRIPTION OF THE DRAWINGS

Other objects, features and advantages of the present invention will become more apparent from the following detailed description when read in conjunction with the accompanying drawings, in which:

FIG. 14A is a cross-sectional view of a SONOS-type memory cell in accordance with the third embodiment;

FIG. 14B is a cross-sectional view of a SONOS-type select drain gate;

FIG. 14C is a cross-sectional view of a select source gate;

DESCRIPTION OF THE PREFERRED EMBODIMENTS

The following is a description of preferred embodiments of the present invention, with reference to the accompanying drawings.

(First Embodiment)

Figure 1:
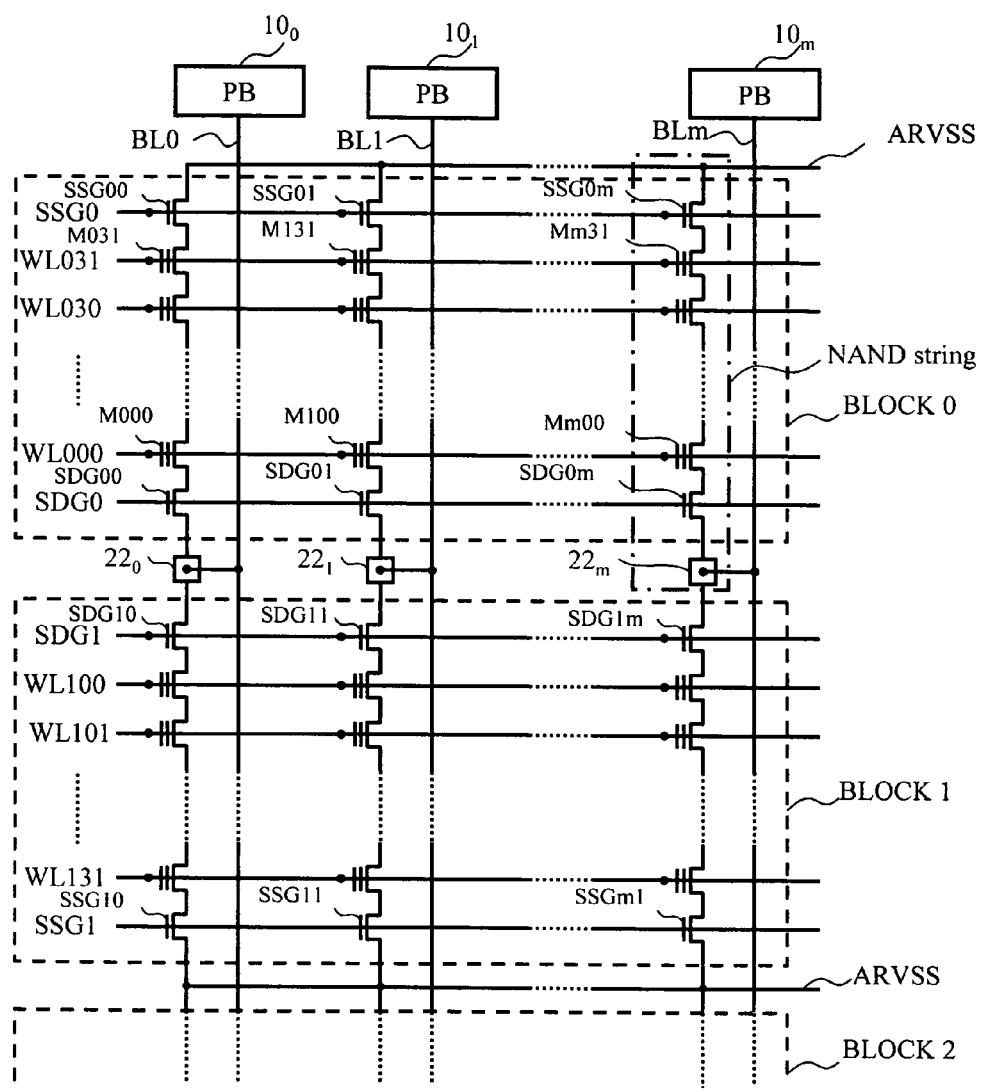
FIG. 1 illustrates the array structure of a conventional FG-type NAND flash memory.
Figure 2:
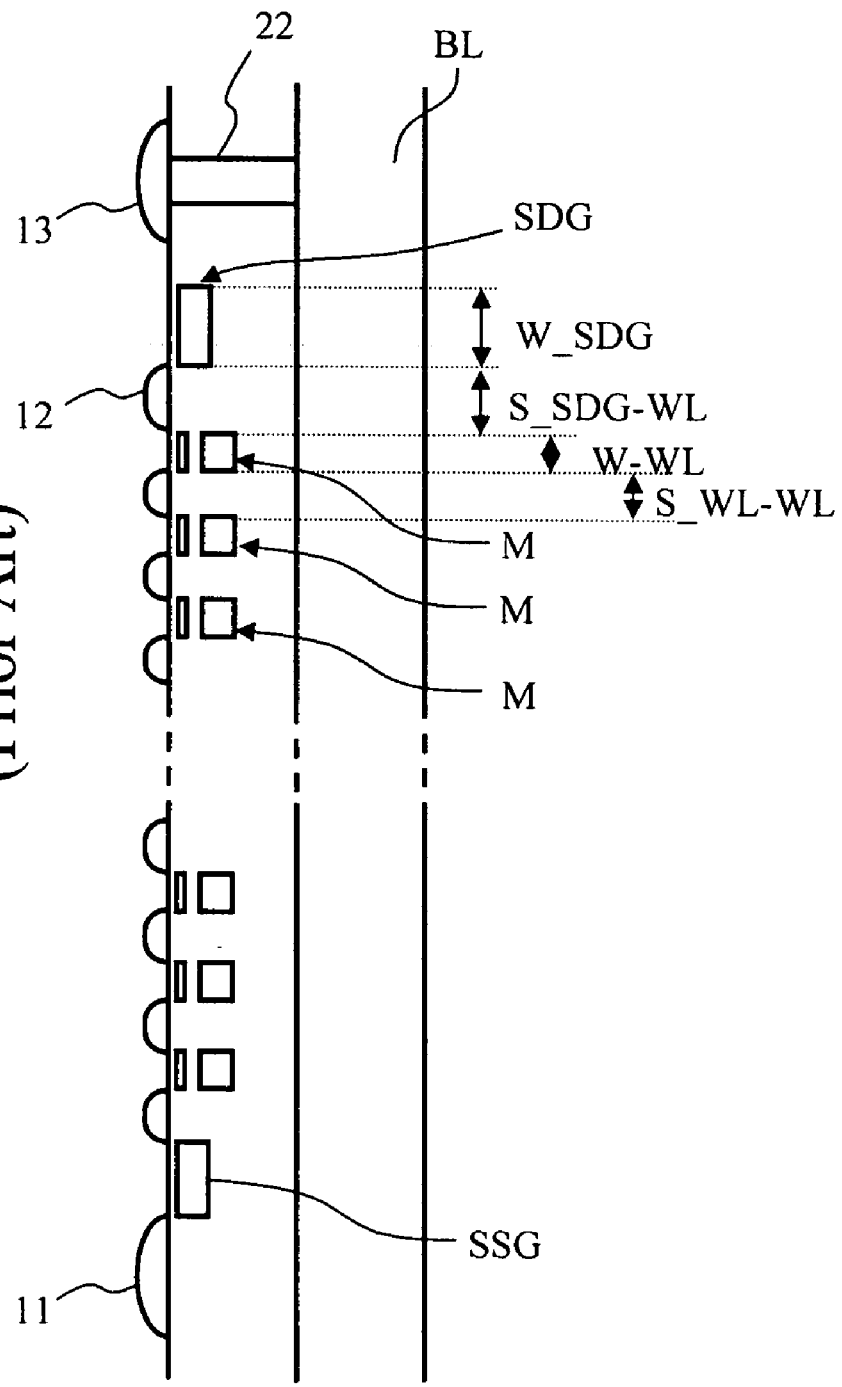
FIG. 2 is a cross-sectional view of the conventional FG-type NAND flash memory.
Figure 3A:
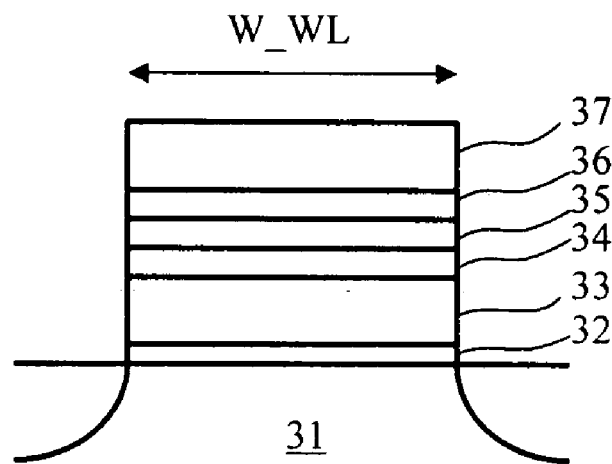
FIG. 3A is a cross-sectional view of a cell of the FG-type NAND flash memory.
Figure 3B:
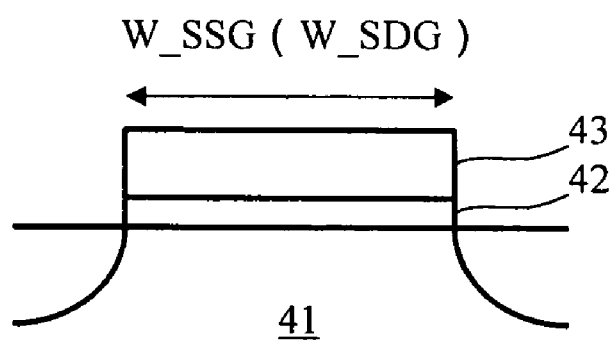
FIG. 3B is a cross-sectional view of a select gate.
Figure 4:
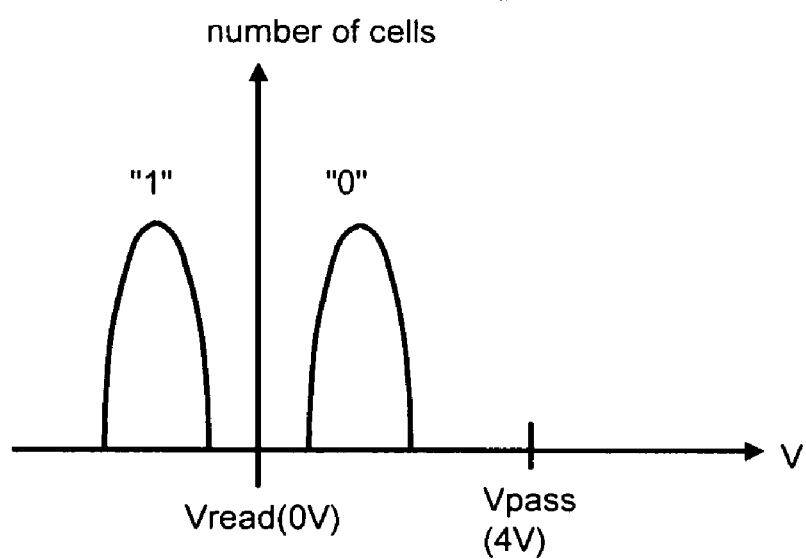
FIG. 4 shows the Vt distribution of the FG-type NAND flash memory.
Figure 5:
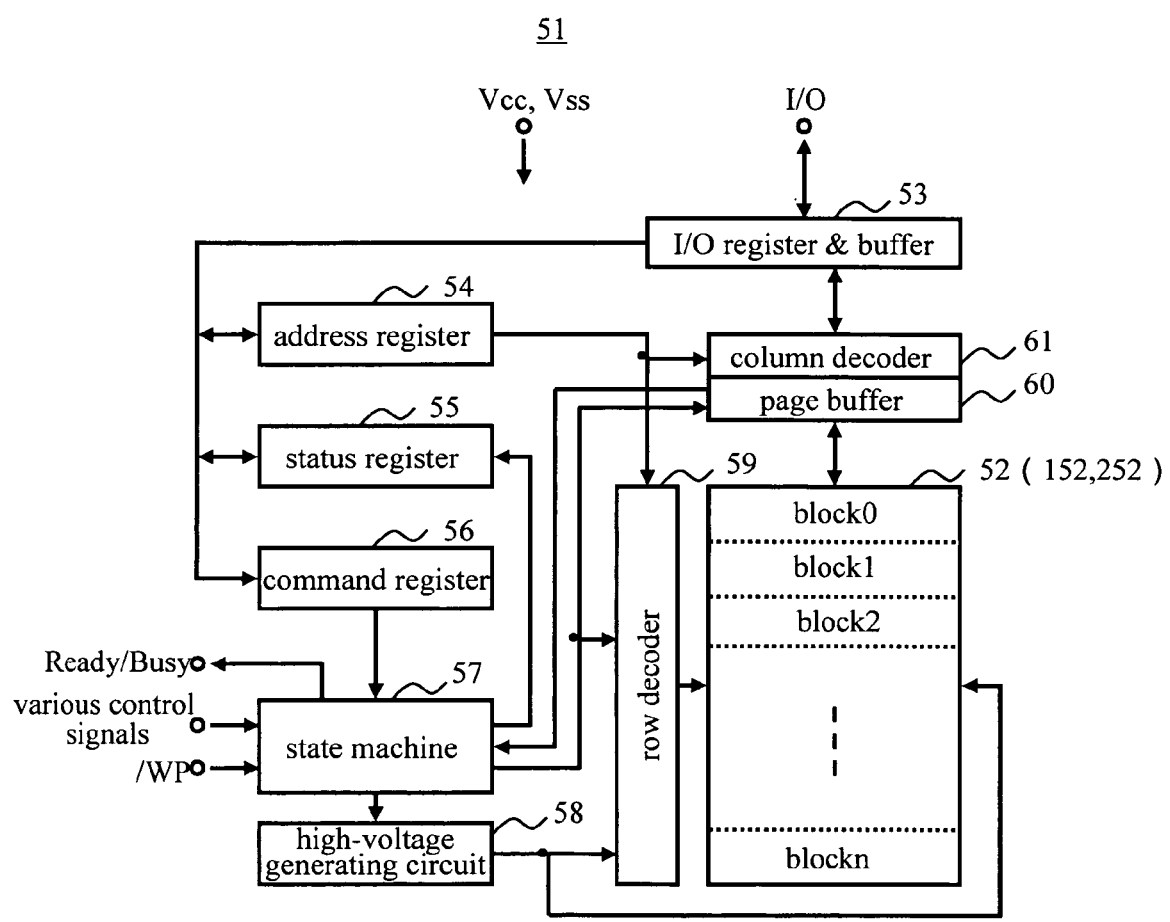
FIG. 5 is a block diagram of a NAND flash memory in accordance with a first embodiment of the present invention.

FIG. 5 is a block diagram of a NAND flash memory in accordance with a first embodiment of the present invention. The flash memory 51 includes a memory cell array 52, an I/O register buffer 53, an address register 54, a status register 55, a command register 56, a state machine 57, a high-voltage generating circuit 58, a row decoder 59, a page buffer 60, and a column decoder 61.

The memory cell array 52 has rewritable non-volatile memory cell transistors aligned with word lines WL and bit lines BL that are arranged in a matrix fashion.

The I/O register buffer 53 controls various signals and data corresponding to I/O terminals. The address register 54 temporarily stores address signals that are input through the I/O register buffer 53. The status register 55 temporarily stores status information. The command register 56 temporarily stores operation commands that are input through the I/O register buffer 53.

The state machine 57 controls the operation of each circuit in the device in response to each control signal. The high-voltage generating circuit 58 generates high voltages to be used in the device. The high voltages to be used in the device include a data-writing high voltage, a data-erasing high voltage, a data-reading high voltage, and a verifying high voltage to be used for checking whether adequate writing or erasing is performed in the memory cells at the time of data writing or erasing.

The row decoder 59 decodes a row address that is input through the address register 54, and selects the corresponding word line WL. The page buffer 60 includes a data latch circuit and a sense amplifier circuit. The page buffer 60 latches data stored in each of the memory cells connected to the same word line, and outputs the latched data. The column decoder 61 decodes column addresses that are input through the address register 54, and selects column data that have been read into the page buffer 60. The I/O register and buffer 53, the row decoder 59, the column decoder 61, and the high-voltage generating circuit 58 operate under the control of the state machine 57.

Figure 6:
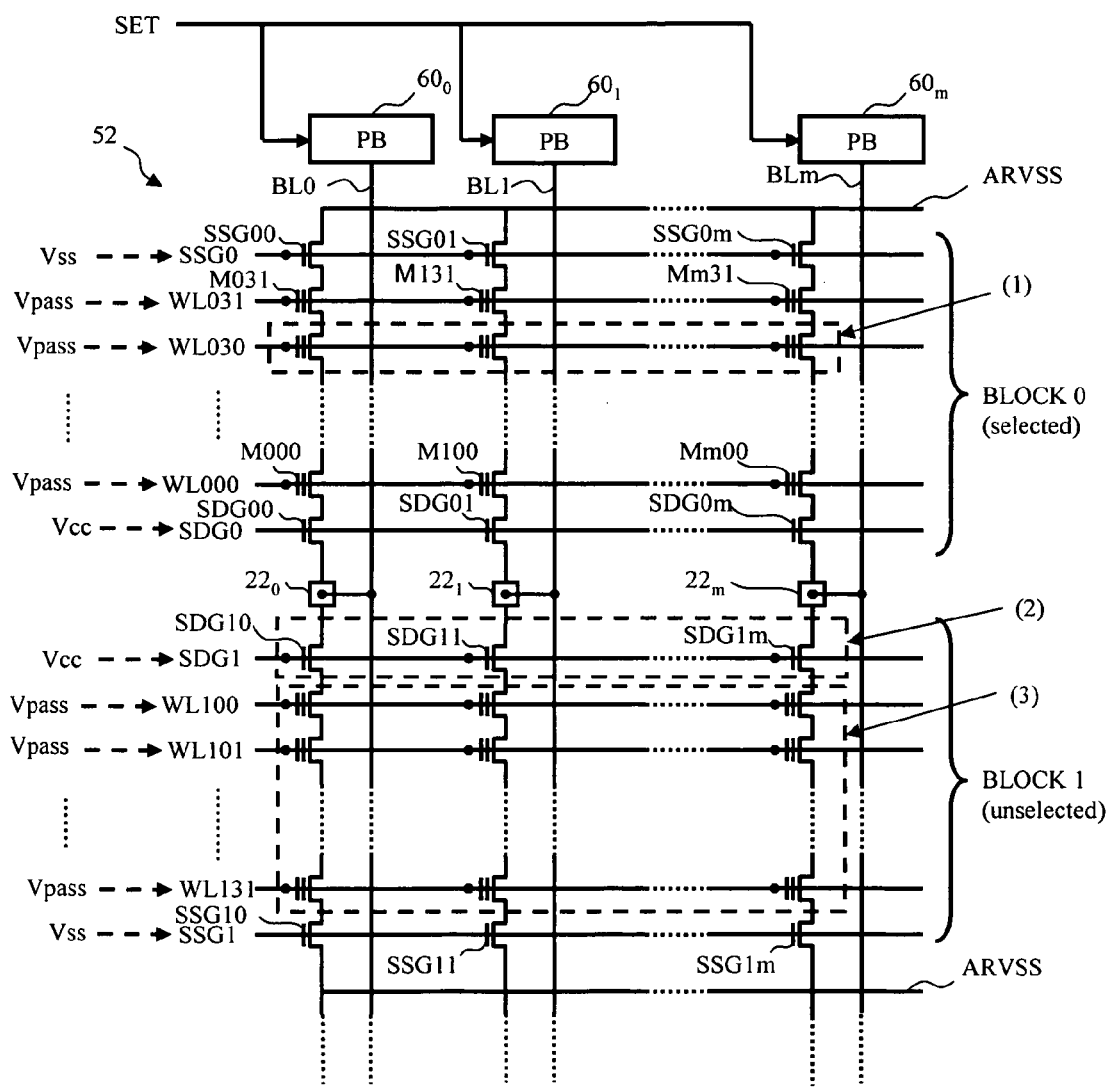
FIG. 6 shows the array structure of a FG-type NAND flash memory and the voltage conditions for precharging in accordance with the first embodiment.

FIG. 6 illustrates the structure of a FG-type NAND flash memory array and the precharging voltage conditions for reading data in accordance with the first embodiment. Reference numeral 52 indicates a memory cell array, and reference numeral 60 indicates a page buffer. Thirty-two FG-type memory cells are connected in series, so as to form a NAND string. A select drain gate SDG0m and a select source gate SSG0m are connected to both ends of each NAND string. The select drain gate SDG0m is further connected to the bit line BLm via a drain contact 22m, and the bit line BLm is connected to the page buffer 60m.

The block formed with m (m being 512 bytes+16 bytes) of NAND strings forms one erasing unit. The m of memory cells that are connected to one word line WL form one page that is an access unit for reading and programming. Accordingly, reading and programming can be performed simultaneously on the m of memory cells. Other blocks are also arranged in the direction of the bit lines BL. The bit line BLm is shared among the blocks. Each two neighboring blocks are mirror symmetric about the drain contact 22. A desired block is selected by controlling the corresponding select drain gate SDG and select source gate SSG in accordance with an address signal, and other blocks remain unselected. In the example shown in FIG. 6, the block BLOCK0 is the selected block, and the block BLOCK1 is an unselected block. In FIG. 6, (1) indicates a selected page (Sel WL).

Figure 7:
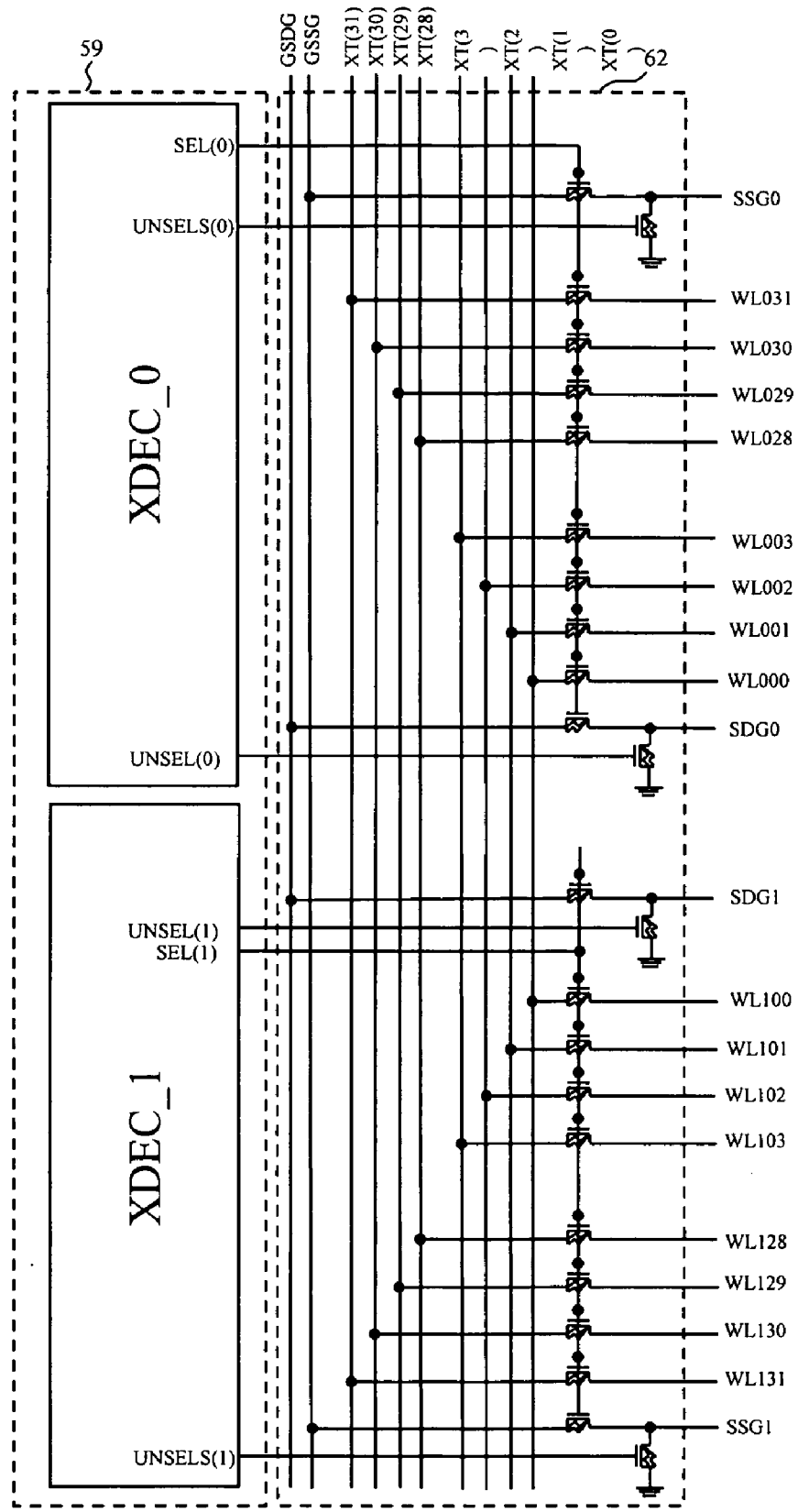
FIG. 7 illustrates the row decoder and a switching circuit.

FIG. 7 illustrates a row decoder and a switching circuit. In FIG. 7, reference numeral 59 indicates the row decoder shown in FIG. 5, and reference numeral 62 indicates a switching circuit. The row decoder 59 has a decoder XDEC_n for each block, and decodes addresses that are supplied from the address register 54. The switching circuit 62 activates the word line of a memory cell M, the select line SSGn of a select source gate SSC, and the select line SDGn of a select drain gate SDG, in accordance with decoding results. A block n is selected by a signal SEL(n) supplied from the corresponding decoder XDEC_n. Here, all the word lines WLn00 through WLn31 in the block n, the select line SDGn of the select drain gate, and the select line SSGn of the select source gate are connected to voltage supply lines (XT(0) through XT(31), GSSG, and GSDG) extending from the row decoder 59 via a pass transistor. A signal UNSEL(n) turns off the select drain gate SDGn in the block n, using a pull-down transistor. A signal UNSELS(n) turns off the select source gate SSGn in the block n, using a pull-down transistor.

Next, a reading operation of the NAND flash memory in accordance with the first embodiment is described. Table 1 shows the reading conditions in a selected block and an unselected block in accordance with the first embodiment.

mately 1V. At this point, a high voltage of approximately 6V (approximately Vpass+the threshold value of a pass transistor) is applied as a voltage HVPP to the signal lines SEL(0) and SEL(1) for the pass transistor that selects the word lines WL and the select gates both in the selected block and the unselected block.

Figure 8:
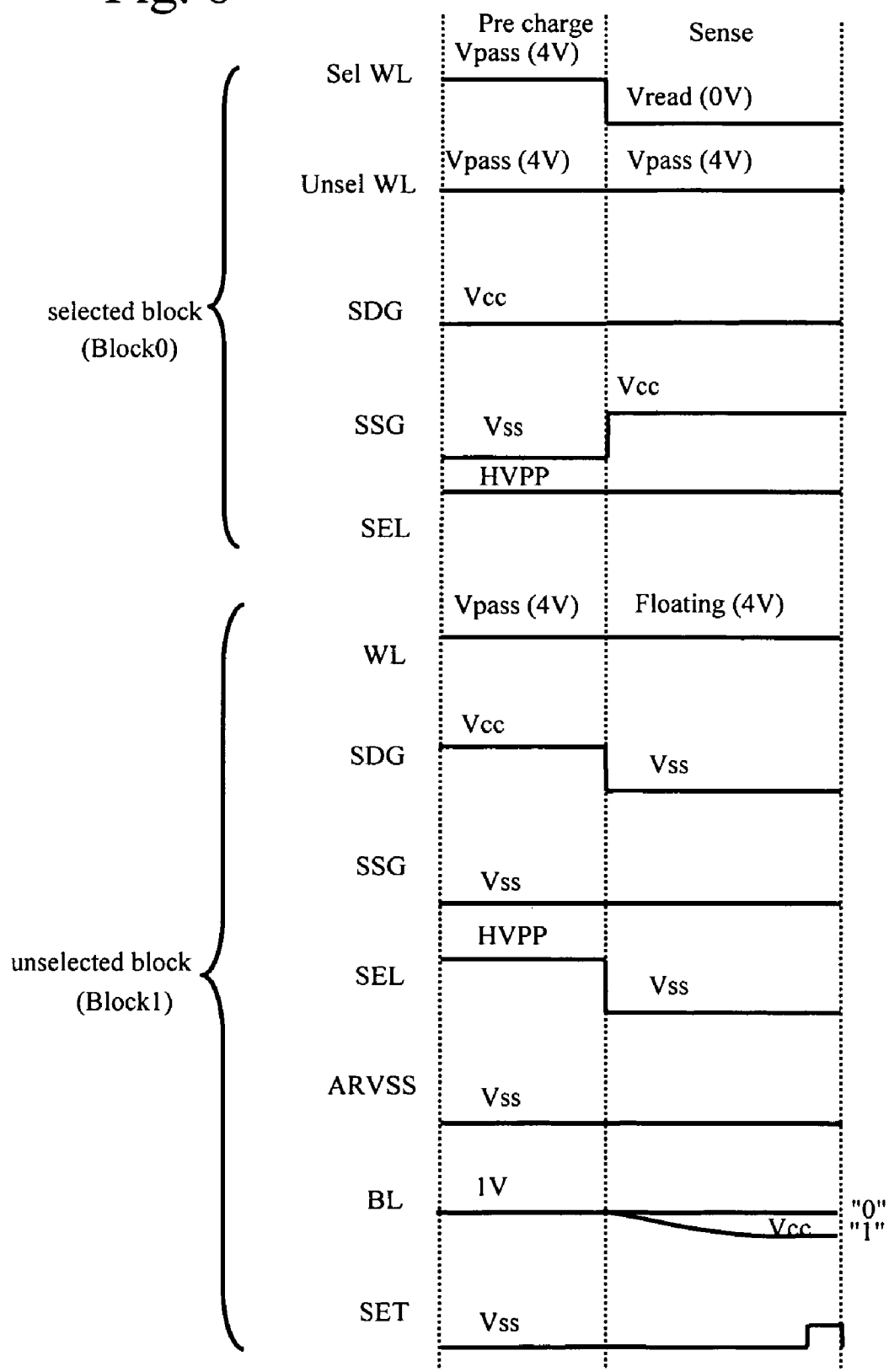
FIG. 8 is a timing chart of the voltage conditions for reading in accordance with the first embodiment.

A sensing operation then starts. In the sensing operation, voltages are applied as shown in FIG. 8, and the select drain gate In of the unselected block that has been ON is turned OFF. In this manner, the voltage of the unselected word lines WL is put into a floating state. The floating word lines WL hold the voltage Vpass (4V). This can be realized by setting the signal SEL(L) to Vss and the signal UNSEL(1) to Vcc. By doing so, a back bias is applied to the select drain gate SDG1n of the unselected block BLOCK1. In other words, a voltage of approximately 1V is constantly applied to the source of the select drain gate SDG1n of the unselected block BLOCK1. Accordingly, the select drain gate SDG1n can be more certainly put into an OFF state, compared with

TABLE 1

| | SELECTED BLOCK (BLOCK 0) | | | | UNSELECTED BLOCK (BLOCK 1) | | | | |
|---|---|---|---|---|---|---|---|---|---|
| | Sel WL | Unsel WL | SDG | SSG | WL | SDG | SSG | ARVSS | BL |
| Pre-charge | Vpass(4 V) | Vpass (4 V) | Vcc | 0 V | Vpass (4 V) | Vcc | 0 V | 0 V | 1 V |
| Sense | Vread(0 V) | Vpass (4 V) | Vcc | Vcc | Floating (or Vpass) | 0 V | 0 V | 0 V | sensed |

As shown in Table 1, voltages are applied to the selected word line WL (Sel WL), the unselected word line WL (UNsel WL), the selected drain gate SDG (Sel SDG), the unselected drain gate SDG (Unsel SDG), the selected source gate SSG (Sel SSG), the unselected source gate SSG (Unsel SSG), the array Vss lines ARVSS, and all the bit lines (BL), thereby precharging all the bit lines BL.

FIG. 8 is a timing chart of the voltage conditions for reading in accordance with the first embodiment. Reading is started by precharging the bit lines BLm. At this point, a voltage Vpass (4V) is applied to the selected word line WL030, and is also applied to the unselected word lines WL in the selected block BLOCK0. Here, the voltage Vpass is such a voltage that turns on the unselected memory cells even if the data held in the unselected memory cells indicate 0.

In accordance with the present invention, in the adjacent unselected block BLOCK1, a voltage Vcc is applied to the select lines SDG1 of the select drain gate SDG1m (denoted by (2) in FIG. 6), and a voltage Vpass is applied to the word lines WL100 through WL131. By doing so, all the memory cells M (denoted by (3) in FIG. 6) in the unselected block BLOCK1 adjacent to the selected block BLOCK0 are selected. Since a voltage Vss is applied to the select line SSG1 of the select source gate SSG1n, the select source gate SSG1n is OFF. Therefore, the bit lines BLm are charged at approximately 1V, and the channels of the unselected memory cells M that are ON are also charged at approxithe prior art. Thus, leakage current can be restricted in the unselected block BLOCK1 at the time of reading. It is preferable to control the other unselected blocks.

The sensing operation in the selected block BLOCK0 is the same as that of the prior art. The potential of the selected word line WL remains Vss (the potential between the threshold value of data 0 and the threshold value of data 1), and the supply of a precharging voltage to the bit lines is suspended. Also, the select source gate SSG0n is turned on. As a result, the memory cells with the data of 0 among the n of selected memory cells are turned off. Accordingly, the bit lines BLm connected to the memory cells are maintained at 1V. Meanwhile, as the memory cells M with the data of 1 are turned on, the bit lines BLm connected to the memory cells M are discharged, and the voltage drops. After a predetermined period of time passes, a set signal SET for setting sense data in the latch circuit in the page buffer 60m is pulsed, and the sensing operation is completed. The programming and erasing operations are the same as those of the prior art.

(Second Embodiment)

Figure 9:
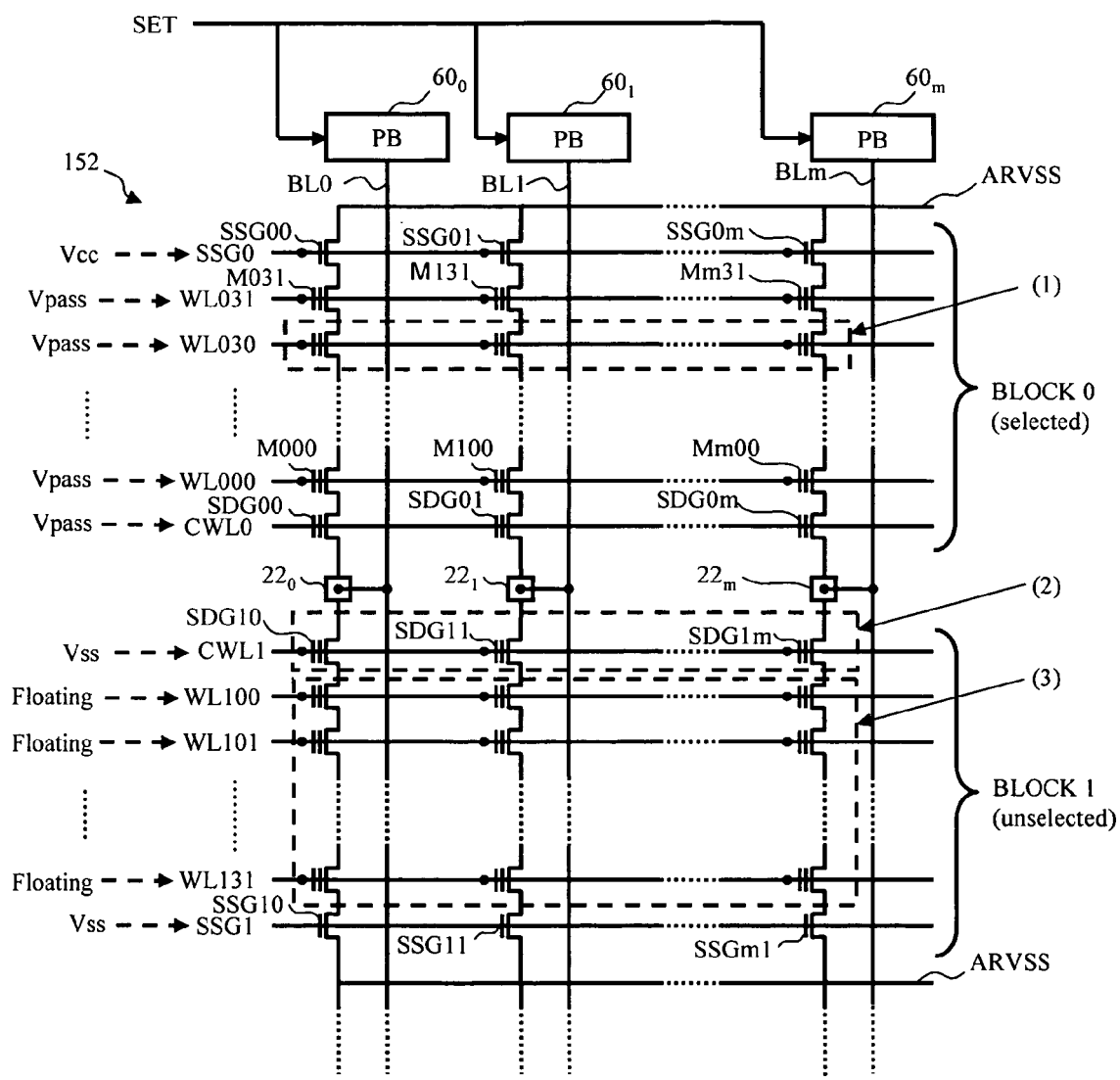
FIG. 9 illustrates the array structure of a FG-type NAND flash memory and the sense voltage conditions for reading in accordance with a second embodiment of the present invention.

Next, a second embodiment of the present invention is described. FIG. 9 illustrates a FG-type NAND flash memory array and sense voltage conditions for reading in accordance with the second embodiment. Table 2 shows the conditions for reading in a selected block and an unselected block in the second embodiment.

TABLE 2

| | SELECTED BLOCK (BLOCK 0) | | | | UNSELECTED BLOCK (BLOCK 1) | | | | |
|---|---|---|---|---|---|---|---|---|---|
| | Sel WL | Unsel WL | SDG | SSG | WL | SDG | SSG | ARVSS | BL |
| Pre-charge | Vpass(4 V) | Vpass(4 V) | Vpass(4 V) | 0 V | Floating | 0 V | 0 V | 0 V | 1 V |
| Sense | Vread(0 V) | Vpass (4 V) | Vpass (4 V) | Vcc | Floating | 0 V | 0 V | 0 V | sensed |

In FIG. 9, reference numeral 152 indicates a memory cell array, and reference numeral 60m indicates a page buffer. Thirty-two FG-type memory cells are connected in series, so as to form a NAND string. A select drain gate SDG0m and a select source gate SSG0m are connected to both ends of each NAND string. In FIG. 9, the block BLOCK0 is a selected block, and the block BLOCK1 is an unselected block.

The second embodiment is characterized in that the select drain gates SDG are FG-type memory cells of the same type as the core cells. The width of each control word line CWLn is the same as the width of each word line WL, and the gap between each control word line CWLn and each corresponding word line WL is equal to the gap between each two neighboring word lines WL. The select source gates SSG are regular select transistors. Also, the select drain gates SDG are programmed, so that the threshold value is greater than that of a regular transistor (0.5V).

Figure 10:
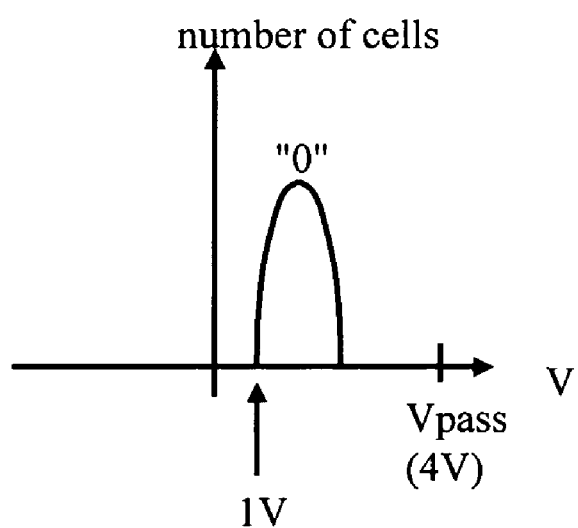
FIG. 10 shows the Vt distribution of a FG-type select gate in accordance with the second embodiment.

FIG. 10 shows the Vt distribution of the FG-type select gates in accordance with the second embodiment. As shown in FIG. 10, all the select drain gates SDG are programmed, so that the threshold value is greater than that of a regular transistor (0.5V). Accordingly, the select drain gate SDG1n can be certainly put into an OFF state at the time of sensing. Thus, leakage in the unselected block BLOCK1 can be restricted.

Reading is started by precharging the bit lines BLm. In the precharging operation, voltages are applied as shown in Table 2 and FIG. 9, and a sensing operation is then started. In the sensing operation, voltages are applied as shown in Table 2 and FIG. 9. The select drain gate SDG1n (denoted by (2) in FIG. 9) in the unselected block BLOCK1 is programmed, so that the threshold value of the select drain gate SDG1n of the unselected block BLOCK1 is greater than that of a regular transistor (0.5V). Accordingly, when the voltage Vss is applied to the gate, the select drain gate SDG1n can be certainly put into an OFF state. In this manner, without the operation in accordance with the first embodiment, leakage in the unselected block BLOCK1 can be restricted by the conventional precharging operation. A greater effect can be of course achieved by combining this technique with the first embodiment.

The select drain gates SDG are formed with the same memories as the core cells, thereby setting the threshold value at a high value. In this manner, each of the control word lines CWL for selecting select drain gates SDG can be designed to have the same width as each word line WL. Accordingly, there is no need to maintain a wide gap between each control word line CWL and each corresponding word line WL, and a small-area array can be achieved.

Figure 11:
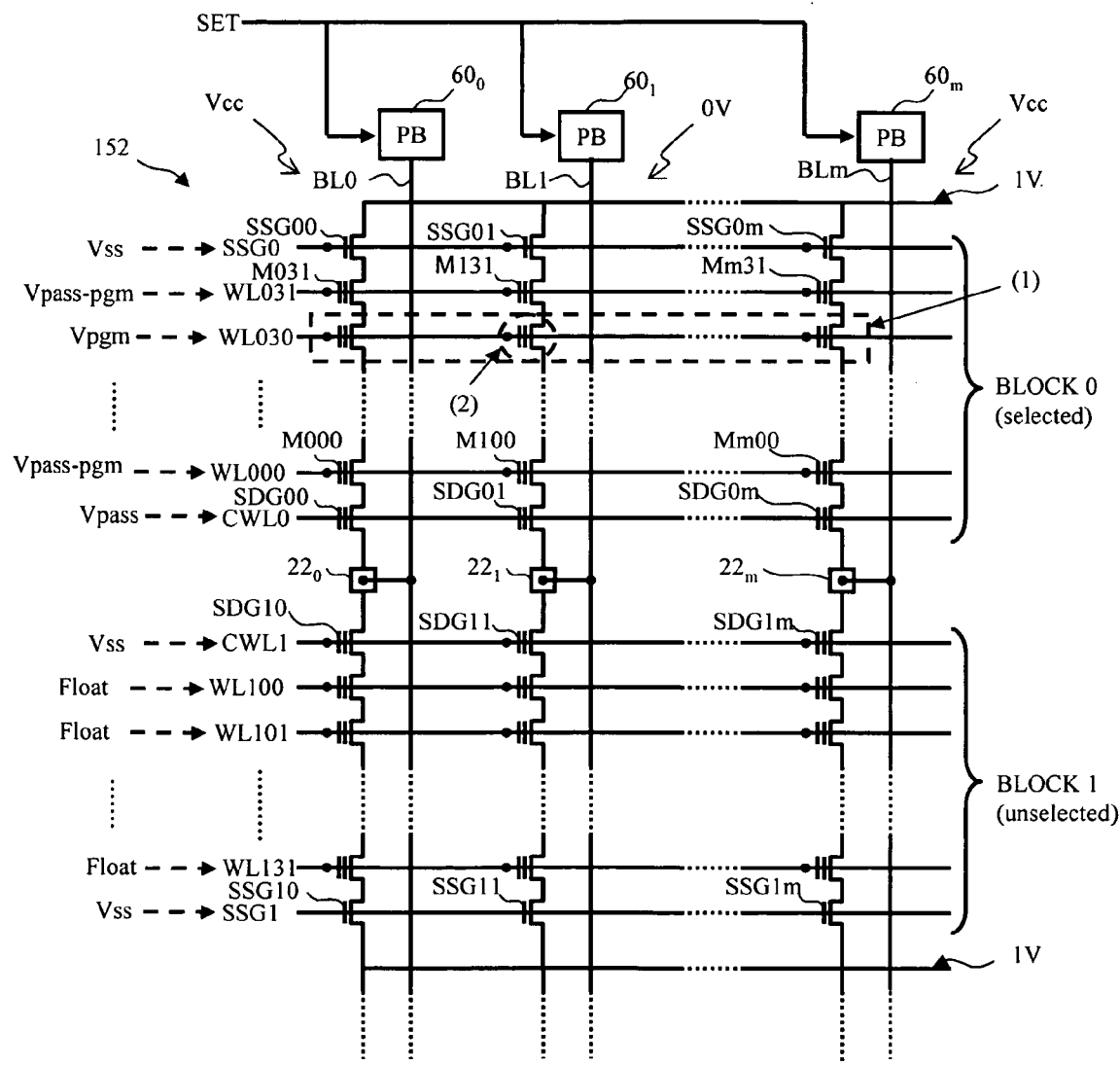
FIG. 11 shows the program voltage conditions in the NAND flash memory array in accordance with the second embodiment.

FIG. 11 illustrates the voltage conditions for programming in the NAND flash memory array in accordance with the second embodiment. In FIG. 11, the selected page is denoted by (1), and the designated memory cell in which writing is to be performed is denoted by (2). First, the voltage of 0V is applied to the selected bit line BL1, and the voltage Vcc is applied to the unselected bit lines BL. In the selected block BLOCK0, the voltage Vpass is applied to the control word line CWL0. At this point, the channel portion of the control word line CWL0 with respect to the unselected bit lines BL (unwritten) other than the selected bit line BL1 have a potential of Vpass-Vth. Here, Vth is the threshold value of the select drain gates SDG. For example, if the voltage Vcc is 3V, the voltage Vpass is 4V, and the voltage Vth is 2V, the channel portion is charged to 2V, and is then put into a floating state.

A voltage of 20V is then applied as Vpgm to the select word line WL030, and a voltage of 10V is applied as Vpass_pgm to the unselected word lines WL in the selected block BLOCK0. The voltage Vpgm is a voltage for programming the cell designated for writing, and the voltage Vpass_pgm is a voltage for applying the voltage from the bit lines BL to the drains of all the cells on the selected word line WL. In the cell designated for writing, electrons are injected to the FG portion from the channel portion through FN tunneling, so that writing is performed. While the voltage of 0V is applied to the channel portion of the cell designated for writing, the potentials of the channels of the control word lines CWL in the floating state, i.e., the channel potentials of all the unselected word lines WL, rise to high voltages. As a result, the channel portions of the cells designated for non-writing also rise to high voltages. Therefore, in the cells designated for non-writing, the difference between the voltage Vpgm and the channel potential is small, and programming is not performed.

Since the select drain gates SDG are programmed like the core cells, the voltage Vpass is applied to turn on the select drain gates SDG, instead of the voltage Vcc. A voltage of approximately 1V is applied to the array Vss line ARVSS, so that the select drain gate SSG0n is completely turned off.

Figure 12:
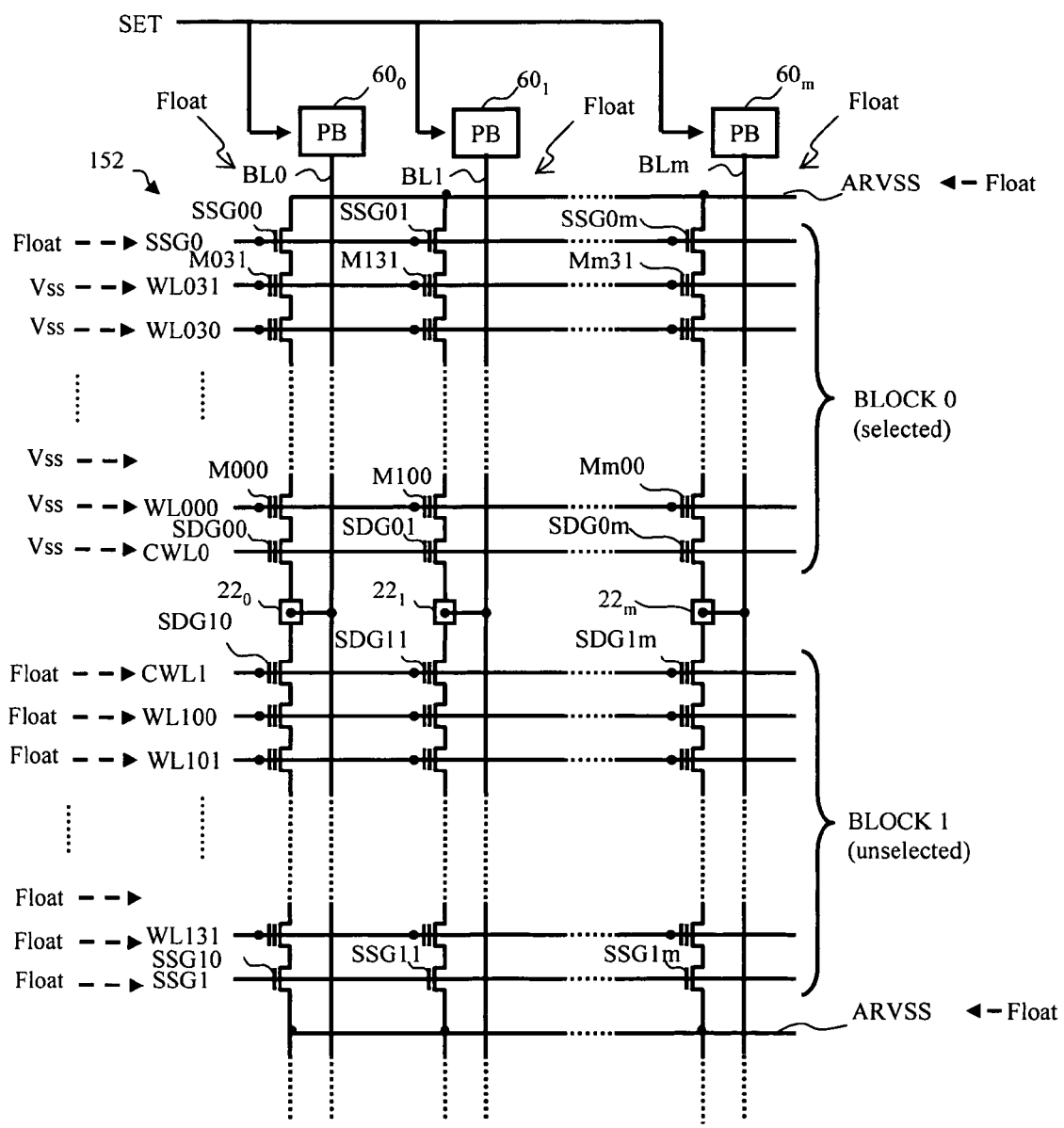
FIG. 12 shows the voltage conditions for erasing in eth FG-type NAND flash memory in accordance with the second embodiment.

FIG. 12 illustrates the voltage conditions for erasing in the FG-type NAND flash memory in accordance with the second embodiment. The erasing operation in this embodiment differs from the conventional erasing operation in that erasing is performed on the select drain gates SDG together with the core cells. Therefore, the voltage Vss is applied to the select drain gates SDG like the core cells. A voltage Vpp (20V) is applied to the substrate, and electrons are discharged from the FG to the substrate through FN tunneling. This embodiment is also characterized by programming the select drain gates SDG after erasing. The programming of the select drain gates SDG is performed by applying the voltage Vpgm to the control word lines CWL, and the voltage Vss to the all the word lines WL as well as the select source gates SSG. To program all the select drain gates SDG, it is not necessary to produce a non-writing state for the cells designated for non-writing through coupling, as in the programming of regular core cells.

(Third Embodiment)

Figure 13:
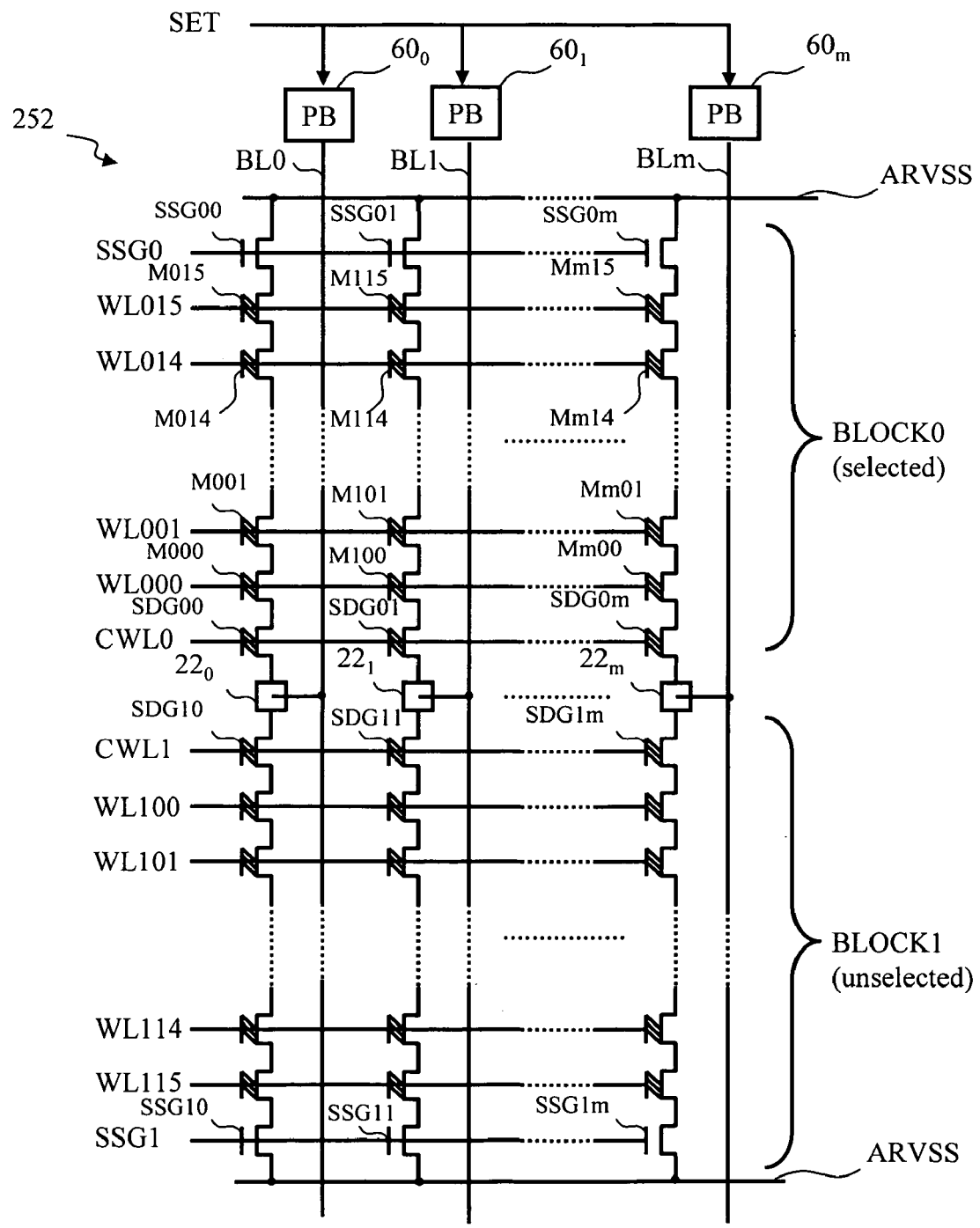
FIG. 13 illustrates the array structure of a SONOS-type NAND flash memory in accordance with a third embodiment of the present invention.

Next, a third embodiment of the present invention is described. FIG. 13 illustrates the array structure of a SONOS-type NAND flash memory in accordance with the third embodiment. In FIG. 13, reference numeral 252 indicates the memory cell array, and 60m indicates a page buffer. Sixteen SONOS-type memory cells are connected in series, so as to form a NAND string. A select drain gate SDG0m and a select source gate SSG0m are connected to both ends of each NAND string. The select drain gates SDG are also of a SONOS type. The select drain gate SDG0m is further connected to the bit line BLm via a drain contact 22m, and the bit line BLm is connected to the page buffer 60m. The block formed with m (m being 512 bytes+16 bytes) of NAND strings forms one erasing unit.

The m of memory cells that are connected to one word line WL form one page that is an access unit for reading and programming. Accordingly, reading and programming can be performed simultaneously on the m of memory cells. Other blocks are also arranged in the direction of the bit lines BL. The bit line BLm is shared among the blocks. Each two neighboring blocks are mirror symmetric about the drain contact 22m. A desired block is selected by controlling the corresponding select drain gate SDG and select source gate SSG in accordance with an address signal, and other blocks remain unselected. In the example shown in FIG. 13, the block BLOCK0 is the selected block, and the block BLOCK1 is an unselected block.

select source gate SSG has a structure in which an oxide film 102 and a gate electrode 103 are stacked in this order on a silicon substrate 101.

Figure 15:
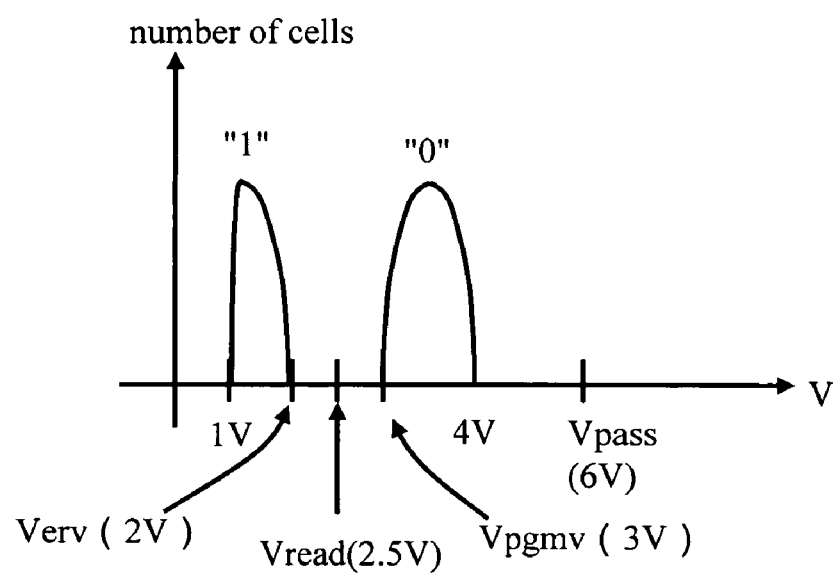
FIG. 15 shows the threshold value distribution in the SONOS-type NAND flash memory.

FIG. 15 shows the threshold value distribution of a SONOS-type NAND flash memory. The graph shown in FIG. 15 shows the Vt distribution of the SONOS-type memory cell shown in FIG. 14A. In the SONOS-type memory cell, the threshold value Vt is saturated at a certain voltage when erasing is performed. Therefore, the Vt distribution of the SONOS-type memory cell differs from the Vt distribution of a regular NAND flash memory. Here, the saturated voltage is 1V. The voltage Verv to be applied to the selected word line WL at the time of verifying erasing is 2V, the voltage Vread to be applied to the selected word line WL at the time of reading is 2.5V, the voltage Vpgmv to be applied to the selected word line WL at the time of verifying writing is 3V, and the voltage Vpass to be applied to the unselected word lines WL at the time of reading is 6V.

Figure 16:
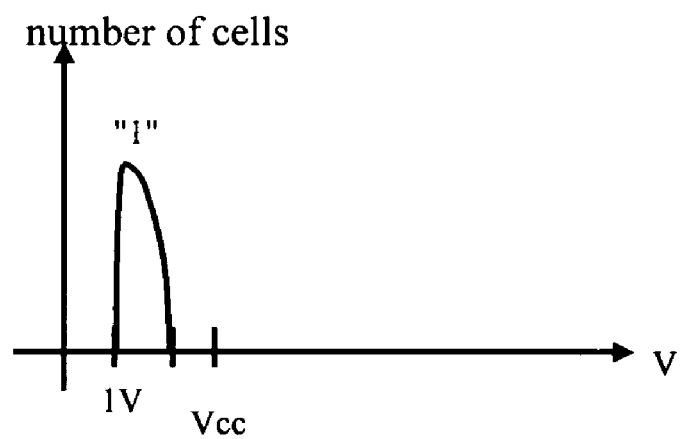
FIG. 16 shows the threshold value distribution of the SONOS-type select drain gate.

FIG. 16 shows the threshold value distribution of a SONOS-type select drain gate. As shown in FIG. 16, a drain gate of a SONOS-type has a high threshold value of approximately 1V in an erasing state (the threshold value of a conventional select transistor is approximately 0.5V). Therefore, it is not necessary to program the select drain gates SDG in advance so as to increase the threshold value Vt as in the second embodiment.

Figure 17:
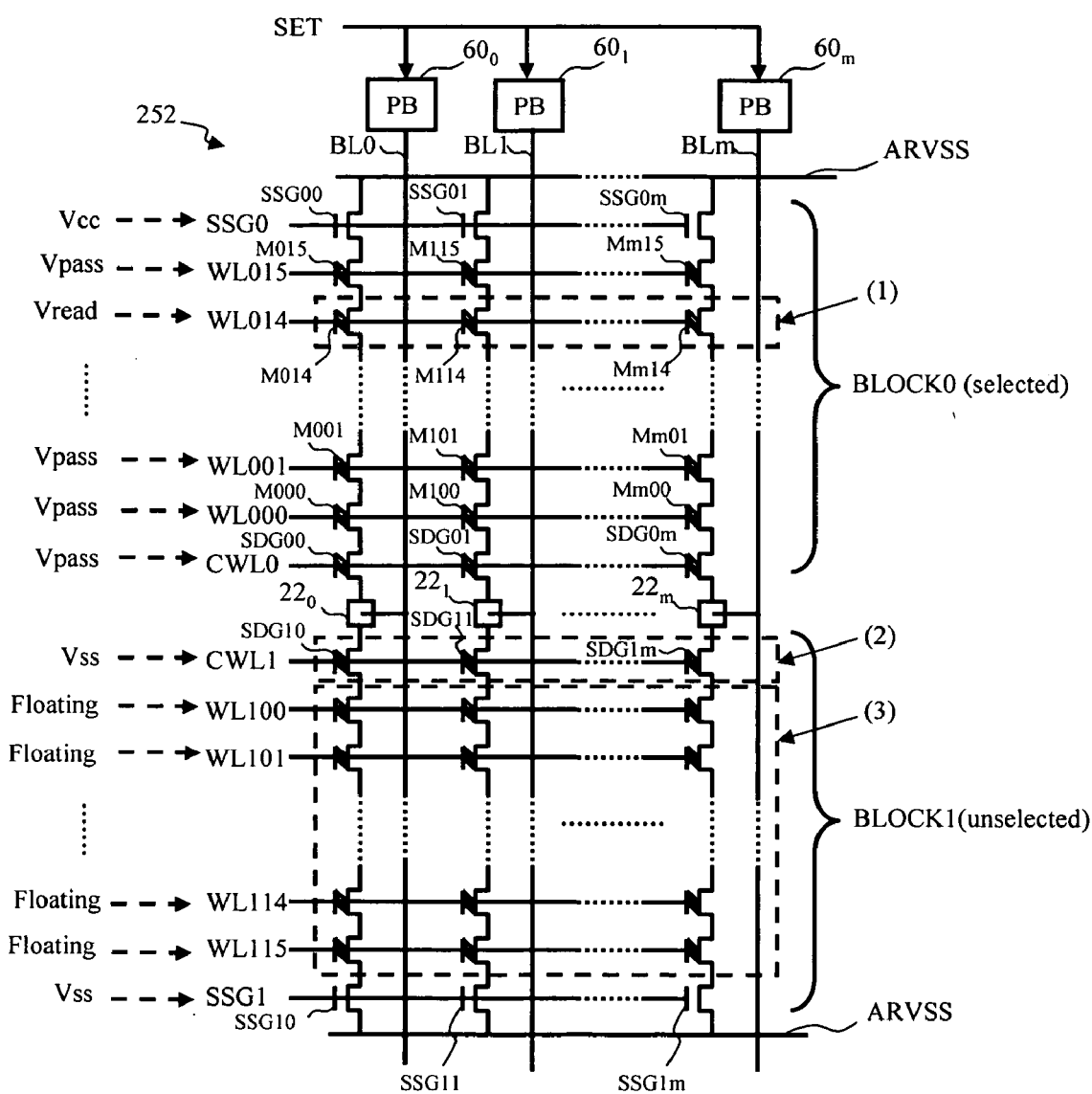
FIG. 17 shows the array structure of the SONOS-type NAND flash memory and the sense voltage conditions for reading in accordance with the third embodiment.

FIG. 17 illustrates the array structure of the SONOS-type NAND flash memory and the sense voltage conditions for reading in accordance with the third embodiment. Table 3 shows the conditions for reading in a selected block and an unselected block in accordance with the third embodiment.

TABLE 3

| | SELECTED BLOCK (BLOCK 0) | | | | UNSELECTED BLOCK (BLOCK 1) | | | | |
|---|---|---|---|---|---|---|---|---|---|
| | Sel WL | Unsel WL | SDG | SSG | WL | SDG | SSG | ARVSS | BL |
| Pre-charge | Vpass(6 V) | Vpass(6 V) | Vpass(6 V) | 0 V | Floating | 0 V | 0 V | 0 V | 1 V |
| Sense | Vread(2.5 V) | Vpass(6 V) | Vpass(6 V) | Vcc | Floating | 0 V | 0 V | 0 V | sensed |

FIGS. 14A through 14C illustrate transistor structures of SONOS-type NAND flash memories in accordance with the third embodiment. FIG. 14A is a cross-sectional view of a SONOS-type memory cell. FIG. 14B is a cross-sectional view of a SONOS-type select drain gate. FIG. 14C is a cross-sectional view of a select source gate. As shown in FIG. 14A, a SONOS-type memory cell M is formed on a silicon substrate 81, and diffusion regions 81A and 81B are formed as a source region and a drain region in the silicon substrate 81. The surface of the silicon substrate 81 is covered with an ONO film 86 having an oxide film 82, a nitride film 83, and an oxide film 84 stacked in this order. Further, a polysilicon gate electrode 85 is formed on the ONO film 86.

As shown in FIG. 14B, a SONOS-type select drain gate SDG is formed on a silicon substrate 91, and diffusion regions 91A and 91B are formed as a source region and a drain region in the silicon substrate 91. The surface of the silicon substrate 91 is covered with an ONO film 96 having an oxide film 92, a nitride film 93, and an oxide film 94 stacked in this order. Further, a polysilicon gate electrode 95 is formed on the ONO film 96. As shown in FIG. 14C, a As shown in Table 3, the voltage Vread is 2.5V, the voltage Vpass is 6V, and the voltage Vcc is 3.0V. Unlike the second embodiment, the threshold value Vt (1V) in an erasing state of each select drain gate SDG is higher than the threshold value (Vt=0.5V) of a regular transistor. Therefore, it is not necessary to program the select drain gates SDG. Using this high value Vt, leakage can be prevented even with small line width. Accordingly, the line width of each control word line CWL can be made equal to the line width of each work line WL.

The difference between the SONOS-type cell of this embodiment and the FG-type cell of the second embodiment lies in the threshold value distribution. The voltage of the selected word line WL at the time of reading is set at the potential Vread between the 0 cell and the 1 cell. Also, the voltage Vpass becomes higher than that in a FG-type cell. The other basic operations are the same as those in a FG-type cell example.

Reading is started by precharging the bit lines BLm. At this point, a voltage Vpass (6V, for example) is applied to the selected word line WL014, and is also applied to the unselected word lines WL in the selected block BLOCK0.

Here, the voltage Vpass is such a voltage that turns on the unselected memory cells even if the data held in the unselected memory cells indicate 0. The select source gates SSG00 through SSG0m are in an OFF state. In the unselected block BLOCK1, the control word lines CWL1 of the select drain gates SDG10 through SDG1m (denoted by (2) in FIG. 17), and the select line SSG1 of the select source gates SSG10 through SDG1m are set to the voltage Vss. The word lines WL 100 through WL 131 are put into a floating state. Thus, all the bit lines BL are charged to approximately 1V.

A sensing operation then starts. In the sensing operation, voltages are applied as shown in Table 3 and FIG. 17. Being a SONOS-type cell, the select drain gate SDG1m in the unselected block BLOCK1 has a greater threshold value than that (0.5V) of a regular transistor. When the voltage Vss is applied to the unselected drain gate SDG1m, the unselected drain gate SDG1m can be certainly turned off. Thus, leakage current can be restricted in the unselected block BLOCK1 at the time of reading.

The select drain gates SDG are formed with the same SONOS-type memory cells as the core cells, thereby setting the threshold value at a high value of approximately 1V. Accordingly, it is not necessary to increase the threshold value Vt by programming the select drain gates SDG in advance as in the second embodiment. In this manner, each of the control word lines CWL for selecting select drain gates can be designed to have the same width as each word line WL, without programming the select drain gates SDG. Accordingly, there is no need to maintain a wide gap between each control word line CWL and each corresponding word line WL, and a small-area array can be achieved. Although the above reading operation is performed under the same conditions as the voltage conditions of the second embodiment, it is of course possible to apply a back bias to the select drain gates in unselected blocks at the time of reading, as in the first embodiment, so as to prevent leakage in the unselected blocks.

In each of the above described embodiments, accurate reading can be performed, and the circuit size can be reduced. Under the control of the state machine 57, a back bias is applied to the select gates in the unselected memory blocks at the time of reading by the high-voltage generating circuit 58, the row decoder 59, and the switching circuit 62. The semiconductor device may be a semiconductor memory device such as a flash memory that is packaged independently, or may be incorporated as a part of a semiconductor device such as a system LSI.

In the second and third embodiments, the select drain gates are formed with memory cell transistors that are capable of storing data. However, the select source gates may be formed with memory cell transistors that are capable of storing data. Although NAND flash memories are used in each of the above described embodiments, other types of memories may be employed.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
    memory blocks each having groups of memory cells that are connected to word lines;
    select gates for selecting the groups of memory cells; and
    an apply circuit that applies, at the time of reading data, a back bias to the select gates of unselected memory blocks.

2. The semiconductor device as claimed in claim 1, wherein each select gate comprises a storage element.

3. The semiconductor device as claimed in claim 2, wherein each select gate is in a programmed state.

4. The semiconductor device as claimed in claim 1, further comprising select lines that are respectively connected to the select gates,
    wherein each select line is spaced apart from an adjacent one of the word lines at a pitch at which the word lines are arranged.

5. The semiconductor device as claimed in claim 1, further comprising select lines that are respectively connected to the select gates,
    wherein each select line has a width substantially equal to the width of each word line.

6. The semiconductor device as claimed in claim 1, wherein the memory cells are of a floating gate type.

7. The semiconductor device as claimed in claim 1, wherein the memory cells are of a SONOS type.

8. The semiconductor device as claimed in claim 1, wherein the select gates comprise the same type of transistors as that of the memory cells.

9. The semiconductor device as claimed in claim 1, wherein the select gates comprise floating gate type memory cells.

10. The semiconductor device as claimed in claim 1, wherein the select gates comprise SONGS type memory cells.

11. The semiconductor device as claimed in claim 1, wherein the select gates are select drain gates.

12. The semiconductor device as claimed in claim 1, wherein the memory cells of each of the groups are connected in series and coupled to a corresponding one of the word lines.

13. A method of controlling a semiconductor device including memory blocks each having groups of memory cells connected to word lines, and select gates that select the groups of memory cells,
    the method comprising the steps of:
    selecting one of the memory blocks at the time of reading data; and
    applying a back bias to the select gates of unselected memory blocks.

14. The method as claimed in claim 13, wherein the select gates comprise storage elements.

15. A method of controlling a semiconductor device, comprising the steps of:
    precharging, at the time of reading data, a bit line running in memory blocks each having groups of memory cells connected to word lines, and select gates that select the groups of memory cells; and
    applying a back bias to the select gates of unselected blocks in a sensing period that follows a precharging period.

16. The method as claimed in claim 15, further comprising the steps of:
    erasing the memory cells of a selected block; and
    programming the select gates in the selected block having erased memory cells.

* * * * *